United States Patent [19]

Obermeyer

[11] Patent Number: 5,132,973
[45] Date of Patent: Jul. 21, 1992

[54] TESTABLE EMBEDDED RAM ARRAYS FOR BUS TRANSACTION BUFFERING

[75] Inventor: John R. Obermeyer, Campbell, Calif.

[73] Assignee: Hewlett-Packard Company, Palo Alto, Calif.

[21] Appl. No.: 432,612

[22] Filed: Nov. 6, 1989

[51] Int. Cl.$^5$ .............................................. G11C 29/00
[52] U.S. Cl. .................................... 371/21.1; 371/21.2
[58] Field of Search ................... 371/21.1, 21.2, 15.1, 371/16.1

[56] References Cited

U.S. PATENT DOCUMENTS

| | | | |
|---|---|---|---|
| 4,204,251 | 5/1980 | Brudevold | 364/200 |
| 4,903,268 | 2/1990 | Hidaka et al. | 371/21.1 |
| 4,961,191 | 10/1990 | Nakagawa et al. | 371/15.1 |
| 4,969,148 | 11/1990 | Nadeau-Dostie et al. | 371/21.1 |
| 5,012,180 | 4/1991 | Dalrymple et al. | 371/15.1 |

OTHER PUBLICATIONS

Serial Interfacing for Embedded-Memory Testing, Silburt et al., 1990.

*Primary Examiner*—Joseph Ruggiero
*Assistant Examiner*—Henry C. Lebowitz
*Attorney, Agent, or Firm*—Roland I. Griffin; Alan H. Haggard

[57] ABSTRACT

A system for testing a RAM array bus transaction buffer without halting system operation or using a special protocol, including a RAM control selection circuit for providing to the RAM either a set of normal control, data and address signals or diagnostic control, data and address signals; a Diagnostics Mode Bit Register (DMBR); a Diagnostics Address Register (DAR); and means for recognizing instructions to write to those registers or to a fictitious Diagnostics Data Register (DDR). First a normal write operation is executed to the DMBR, to control a RAM control selection circuit. The RAM control selection circuit chooses as RAM control signal sources a set of diagnostic sources rather than normal system sources. Second, a selected RAM address is written to the DAR. Third, a write operation is performed to the DDR, causing the selected data to be written to the RAM at the address specified by the DAR. Data is similarly read from the RAM through the DDR.

5 Claims, 2 Drawing Sheets 5,132,973

TESTABLE EMBEDDED RAM ARRAYS FOR BUS TRANSACTION BUFFERING

FIELD OF THE INVENTION

This invention relates to the testing of RAM (random access memory) arrays and, more particularly, to the testing of RAM arrays which are used in digital computer systems for bus transaction buffering.

BACKGROUND OF THE INVENTION

In digital computer systems, such as generically illustrated in FIG. 1, in block diagram form, system resources generally communicate with each other via one or more interconnections called buses. The system resources may include, for example, processors (1, 2 for example), memory (3, 4), and input/output devices (or their controllers) (5, 6, 7). The inter-resource communications generally involve multi bit (and usually multi-byte) information (i.e., data or command/response) transmission packets or packet sequences called transactions, which are exchanged via a bus 8. Only certain transactions are considered valid and are allowed; other potential transactions are screened out as invalid. Thus various rules are established for bus communications, to ensure, inter alia: (1) that only valid information is passed from one resource to another; (2) that only valid sequences of operations occur; and (3) that messages and information are properly delivered to their intended destinations. These rules are referred to as the protocol for the bus. While a considerable number of bus protocols exist, each with distinct advantages and disadvantages, most buses share at least one trait: they restrict the permissible bit sequences which can be transmitted on the bus preventing the transmission of some otherwise possible bit sequences.

Typically, a bus can only support at any given time only one or a small number of inter-resource communications. Thus, if a resource requires access to a bus and the bus is unavailable, that resource will have to wait until the bus later becomes available. To improve communications efficiency over a bus, and to allow system resources to perform useful work while the bus is being utilized by other resources, a technique known as transaction buffering frequently is employed. Transaction buffering is a process whereby each resource obtains access to the bus through a buffer, or buffer memory. One type of buffer often utilized for this purpose is a two-port RAM array. Such an array may, for example, embedded in a VLSI chip containing the circuitry for the associated system resource.

To ensure the integrity of the system, it is desirable to test such RAM array buffers from time to time. For example, it may be advantageous to test each RAM array when the system is "powered up", or when a malfunction must be diagnosed. The use of a RAM array as a bus transaction buffer, however, imposes certain obstacles in this respect. Specifically, the proper operation of a RAM array requires that random data be writeable to and readable from each and every bit of the array. As stated above, however, one thing most (if not all) bus protocols have in common is that they only permit certain bit patterns and sequences to be placed on the bus. In other words, bus protocols typically do not allow all possible bit patterns and sequences to be transmitted. For example, a protocol will typically reject as a destination a resource address which is not valid. Thus, a bus protocol usually will not allow the writing to a transaction buffer of a full range of random data in random order. The use of a bus protocol which screens out invalid transactions or information therefore will often also impede transaction buffer (i.e., RAM array) testing. Moreover, when there is a way to test a transaction buffer, it frequently will require that at least a portion of the system be deactivated, or halted — that is, that system clocks be stopped and normal bus transactions be prevented.

Accordingly, it is an object of the present invention to provide, for use as a transaction buffer, a RAM array which is capable of being fully tested.

Another object of the invention is to provide a method for testing a RAM array transaction buffer without having to halt the system.

Still another object is to provide a method and apparatus for testing a RAM array transaction buffer without requiring any changes or special adaptations to the system bus and its protocol.

SUMMARY OF THE INVENTION

The foregoing and other objects as will hereinafter appear are achieved in a RAM array transaction buffer which is provided with "functional test generator" means for placing arbitrary data into selected locations in the array, and means for retrieving that data. Such functional diagnostic testing permits examination of transaction buffers without "bringing the system" down — i.e., without halting the system clocks and stopping all other system operation. To perform a functional test, first a normal write operation is executed over the bus, to a one-bit register called the Diagnostics Mode Bit, to set that register to (for example) a "1", to control a RAM control selection circuit. In turn, the RAM control selection circuit chooses as RAM control signal sources a set of diagnostic sources rather than normal system sources. Second, a write operation is performed to a special register called the Diagnostics Address Register. The information written to the Diagnostics Address Register is the RAM address to which information will be written. The RAM control selection circuit will supply this address to the RAM instead of the normal address from the bus. Third, a write operation is performed to a special, fictitious register called the Diagnostics Data Register. This data is actually written to the RAM at the address provided by the Diagnostics Address Register.

To read diagnostic data from the RAM, the same write operations are performed to the Diagnostics Mode Bit and to the Diagnostics Address Register, but a read operation is then performed to the Diagnostics Data Register. This causes a read operation to be performed to the RAM at the address in the Diagnostics Address Register. If the Diagnostics Mode Bit is already set and the Diagnostics Address Register is already loaded with the target address, of course, the necessary operation the read operation to the Diagnostics Data Register.

In addition to the RAM array itself, the invention thus utilizes a RAM control selection circuit for providing to the RAM either a set of normal control, data and address signals or diagnostic control, data and address signals; a Diagnostic Mode Bit register; a Diagnostics Address Register; and means for recognizing instructions to write to those registers and to write to and read from the fictitious Diagnostics Data Register.

The invention will be more fully understood from the detailed description set forth below, when read in conjunction with the accompanying drawing. The detailed description is presented by way of example only, and should not be considered limiting.

DETAILED DESCRIPTION

Figure 1:
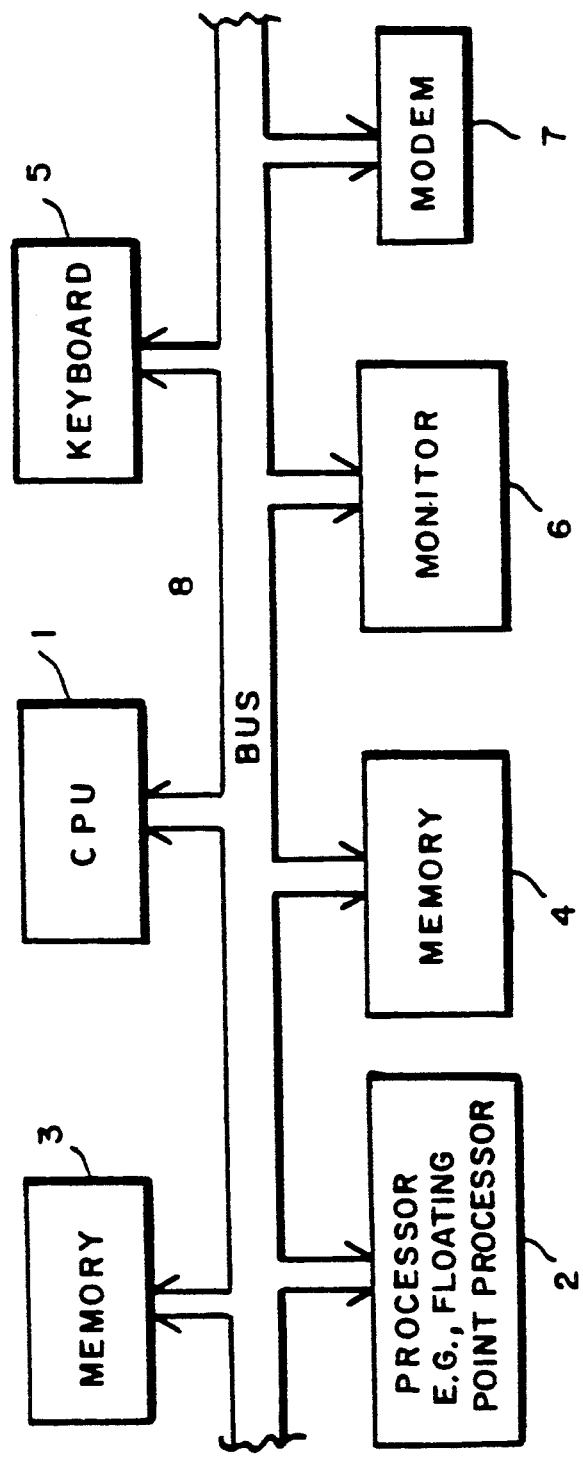
FIG. 1 is a block diagram of a generic digital processing system of the type in which the present invention might be used.
Figure 2:
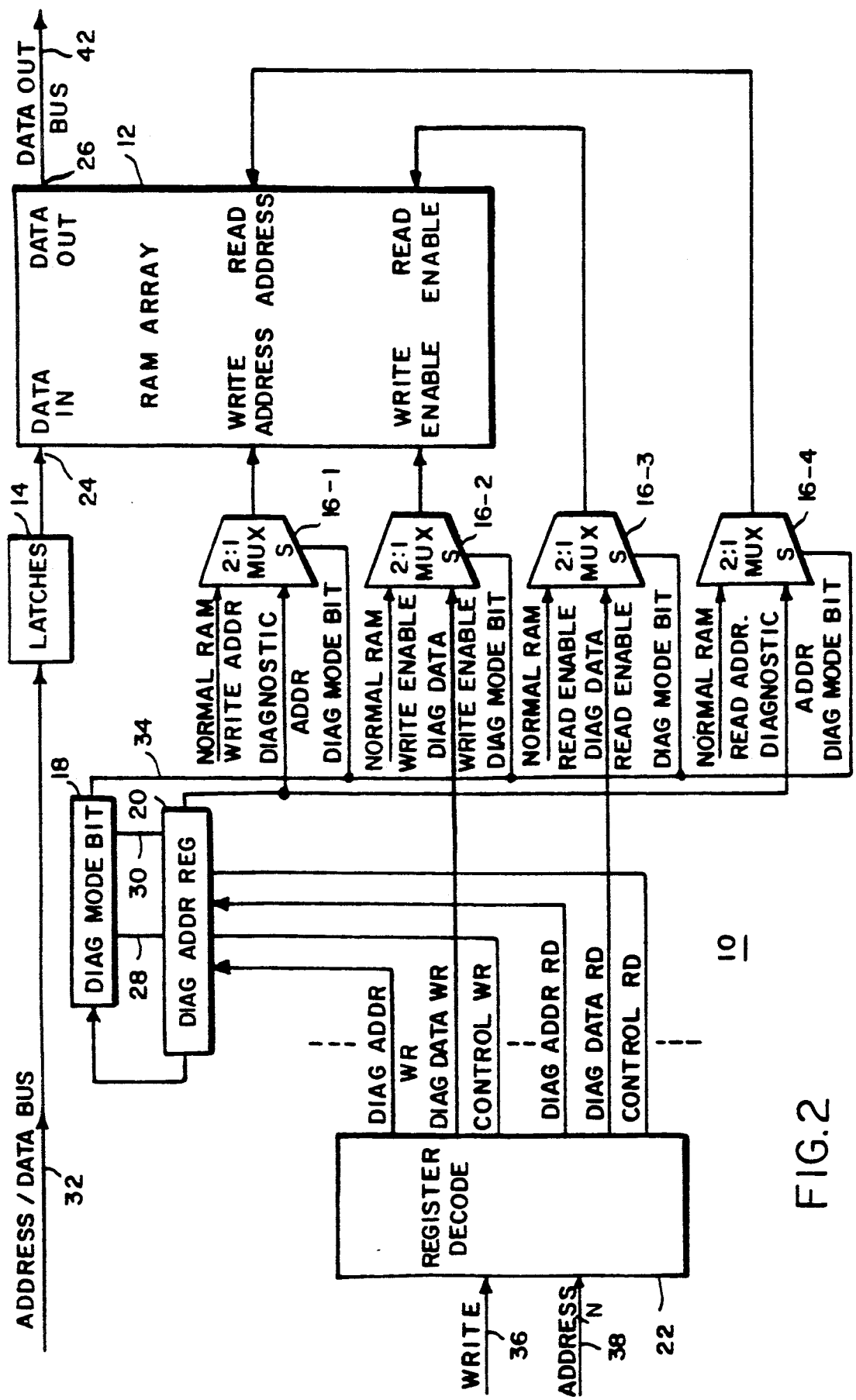
FIG. 2 is a block diagram of a testable embedded RAM array for bus transaction buffering, according to the present invention.

Referring to FIG. 2, a block diagram is shown of a testable embedded RAM array 10 for buffering bus transactions, according to the present invention. The system includes a RAM array 12, a set of latches 14, a set of multiplexers (or "muxes") 16-1 through 16-4, a register 18 called the Diagnostic Mode Bit Register (DMBR), a register 20 called the Diagnostic Address Register (DAR) and bus register decode logic 22. The RAM array 12 has two data ports, a data input port 24 and a data output port 26.

The operation of the testable embedded RAM array is controlled in part by the state of a Diagnostic Mode Bit which is held in a single-bit Diagnostic Mode Bit Register 18. The state of the Diagnostic Mode Bit is a function of CONTROL READ and CONTROL WRITE signals supplied by register decoder 22 over lines 30 and 28, respectively, as more fully explained below. The Diagnostic Mode Bit is provided over line 34 to the control input of each of muxes 16-1 through 16-4. The Diagnostic Mode Bit Register, together with the muxes, forms a selection means for providing to the RAM array either normal control, address and data signals or diagnostic control, address and data signals. The muxes 16-1 through 16 4 are all 2:1 muxes which select as their outputs one of their two inputs, the selection being effected by the state of the control input, labelled "S".

When the Diagnostic Mode Bit is low or a "0", corresponding to selection of normal, non-diagnostic operation, the muxes perform as follows. Mux 16-1 provides to the RAM array's write address input the normal RAM write address, which is conventionally decoded (for example, by register decoder 22). (To avoid unnecessarily obfuscating the invention, the decoding of the write address and its connection to the mux input are not explicitly shown.) The mux 16-2 supplies to the RAM array's write enable input the normal RAM write enable signal. The mux 16-3 supplies to the RAM array's read enable input the normal RAM read enable signal. The mux 16-4 provides to the RAM array's read address input the normal RAM read address, which is decoded (e.g.) by register decoder 22. The data input for the RAM array is supplied to the input port 24 from bus 32 via a set of latches 14.

When the Diagnostic Mode Bit is high or a "1", corresponding to selection of diagnostic operation, the muxes perform as follows. Mux 16-1 provides to the RAM array write address input an address from the Diagnostic Address Register (DAR) 20. The mux 16-2 supplies to the RAM array's write enable input a Diagnostics Data Write Enable signal from the register decoder 22, responsive to the decoding of a write operation of the Diagnostics Data Register, when such an operation has been transmitted on the bus. The mux 16-3 supplies to the RAM array's read enable input a Diagnostics Data Read Enable signal from the register decoder 22, responsive to the decoding of a read operation to the Diagnostics Data Register, when such an operation has been transmitted on the bus. The mux 16-4 provides to the RAM array's read address input the diagnostics address from Diagnostic Address Register 20, which may be the same address as was supplied by MUX 16-1 to the array's write address input, if there has been no intervening write operation to the Diagnostic Address Register. The diagnostic read operation thus may read from the same location written to in the diagnostic write operation, allowing proper operation of that location to be verified. The data input for the RAM array is supplied to the input port 24 via the latches 14, as in non-diagnostics mode.

To perform functional testing, a valid sequence of at least three transactions is executed across the system bus 32, while the system is fully operational. The first transaction is a write operation to set the Diagnostics Mode Bit. The second transaction writes to the DAR a RAM address to be tested. The third transaction is either a read operation or a write operation to "pseudo diagnostics data register", termed the Diagnostic Data Register (DDR). The DDR is not an actual memory register. Rather, a command to write to the DDR is decoded by the register decoder 22 to produce a Diagnostics Data Write Enable signal to the array, which allows data from latches 14 to be written to the address which has been stored in the DAR. Conversely, a command to read the DDR is decoded by the register decoder 22 to produce a Diagnostics Data Read Enable signal to the array, which allows the contents of the RAM location specified by the DAR to be read out. Once the diagnostics transaction sequence is complete, the Diagnostics Mode Bit may be cleared by an appropriate write operation.

Both the Diagnostic Address Register and the Diagnostic Data Register are read/write registers.

Of course, if non-destructive testing is desired (i.e., it is desired to preserve the RAM array's context intact during the testing process), a diagnostic read operation must be peformed before a diagnostic write to its address. The "live" data is then stored elsewhere while diagnostic data is written to and read from that address to verify its integrity. After the address is "approved" as functioning correctly, the live data can be restored.

The present invention thus permits the full functional testing of the RAM array, even though full testing would not normally be permitted by the bus protocol. The full functional test mode is achieved with the addition of only a small amount of circuitry and no special test protocol is required.

Having thus described the inventive concept and a specific embodiment, it should be apparent that various alterations, modifications and improvements may readily be made and will occur to those skilled in the art. Thus the foregoing discussion is presented by way of example only, and is not intended to be limiting. The invention is limited only by the following claims and equivalents thereto.

What is claimed is:

1. In a digital data processing system having a plurality of system resources, a bus for inter-resource communication and at least one RAM array used as a transaction buffer for buffering communications via the bus, the RAM array having a set of control inputs for receiving signals for controlling the enabling of reading and writing operations and for receiving signals designating addresses for reading and writing, an apparatus for allowing external testing of the RAM array, the apparatus comprising:

a. a mode control register;
   b. means operatively associated with the RAM array for supplying a first set of signals to its control inputs responsive to the mode control register being in a first state, and for supplying a second set of signals to its control inputs responsive to the mode control register being in a second state;
   c. means operatively associated with the bus for setting the mode control register to the second state responsive to a predetermined first transaction being executed over the bus;
   d. a predetermined register, termed the Diagnostic Address Register;
   e. means operatively associated with the bus for writing to the Diagnostic Address Register data representing a RAM address, in response to a predetermined second transaction being executed over the bus; and
   f. means responsive to the mode control register being in the second state, for writing to said RAM address data transmitted on the bus.

2. The apparatus of claim 1 wherein the means for writing to said RAM address comprises means responsive to a predetermined third transaction being executed over the bus, such third transaction being an operation to write data.

3. The apparatus of claim 2 wherein in the third transaction, the operation to write data is to a fictitious register.

4. A method of accessing a RAM array used as a transaction buffer for buffering communication via a bus in a digital data processing system having a plurality of system resources and a bus for inter-resource communication, the method allowing external testing of the RAM array and comprising the steps of:

a. executing via the bus a normal write operation to a mode control register;
   b. executing via the bus a write operation to a second register, said operation writing to the second register a selected RAM address;
   c. executing a write operation via the bus to write selected data to a fictitious register; and
   d. responsive to the writing to the mode control register and the fictitious register, writing the selected data to the RAM at the address specified by the contents of the second register.

5. The method of claim 4 further including the steps of:

e. executing via the bus a read operation to read selected data from the fictitious register; and
   f. responsive to the writing to the mode control register and the reading of the fictitious register, reading the RAM at the address specified by the contents of the second register.

* * * * *